United States Patent [19]
Johnson

[11] Patent Number: 5,637,436
[45] Date of Patent: Jun. 10, 1997

[54] METHOD FOR REMOVING PHOTORESIST COMPOSITION FROM SUBSTRATE SURFACES

[75] Inventor: Donald W. Johnson, Brookline, Mass.

[73] Assignee: Hoechst Celanese Corporation, Somerville, N.J.

[21] Appl. No.: 416,234

[22] Filed: Apr. 4, 1995

Related U.S. Application Data

[62] Division of Ser. No. 33,076, Mar. 10, 1993, Pat. No. 5,426,017, which is a continuation of Ser. No. 531,214, May 31, 1990, abandoned.

[51] Int. Cl.$^6$ ....................................................... G03F 7/16
[52] U.S. Cl. ..................... 430/169; 430/189; 430/270.14; 430/331
[58] Field of Search ..................................... 430/325, 331, 430/270, 168, 189, 169

[56] References Cited

U.S. PATENT DOCUMENTS

| | | | |
|---|---|---|---|
| 3,511,178 | 5/1970 | Curtin | 101/450 |
| 3,896,664 | 7/1975 | Alburger | 252/301.2 |
| 4,328,304 | 5/1982 | Tachikawa et al. | 430/331 |
| 4,886,728 | 12/1989 | Salamy et al. | 430/331 |
| 5,030,550 | 7/1991 | Kawabe et al. | 430/326 |
| 5,106,724 | 4/1992 | Nogami et al. | 430/331 |
| 5,151,219 | 9/1992 | Salamy et al. | 430/331 |

*Primary Examiner*—John S. Y. Chu
*Attorney, Agent, or Firm*—Sangya Jain

[57] ABSTRACT

Ternary mixtures of $C_4$ to $C_8$ alkyl acetate, $C_4$ to $C_8$ alkyl alcohol, and water, formulated to have a flash point of above 100° F., are disclosed, particularly for use in edge residue removal processes in the fabrication of integrated circuits and like products.

8 Claims, No Drawings

METHOD FOR REMOVING PHOTORESIST COMPOSITION FROM SUBSTRATE SURFACES

This is a divisional of application(s) Ser. No. 08/033,076 filed Mar. 10, 1993, U.S. Pat. No. 5,426,017, which is a continuation of Ser. No. 07/531,214 filed May 31, 1990 now abandoned.

BACKGROUND OF THE INVENTION

The present invention relates generally to the field of microelectronics, e.g., integrated circuits, and more particularly to compositions and methods for removing photoresist compositions from the surfaces of substrates, e.g., silicon wafers, used in the fabrication of integrated circuits. In its most particular regard, the invention relates to compositions and methods for removing unwanted edge residues of photoresist composition from a wafer which has been spin-coated with photoresist.

In very general terms, the fabrication of integrated circuits involves steps for producing polished silicon wafer substrates, steps for imaging integrated circuit pattern geometries on the various wafer surfaces, and steps for generating the desired pattern on the wafer.

The imaging process involves the use of photoresists applied to the wafer surface. Photoresists are compositions which undergo change in response to light of particular wavelength such that selective exposure of the composition through a suitable patterned mask, followed by development to remove exposed or non-exposed portions of the photoresist as the case may be, leaves on the wafer a pattern of resist which replicates either the positive or negative of the mask pattern, and which thus permits subsequent processing steps (e.g., deposition and growth processes for applying various layers of semiconductive materials to the wafer and etching-masking processes for removal or addition of the deposited or grown layers) to be carried out in the desired selective pattern.

The photoresists used in the imaging process are liquid compositions of organic light-sensitive materials which are either polymers per se or are used along with polymers, dissolved in an organic solvent. Critical to the effectiveness of the selective light exposure and development in forming a resist pattern on the wafer substrate is the initial application of the photoresist composition in a thin layer of essentially uniform thickness on the wafer surface. The coating process of choice in the industry is spin-coating. In this process, the flat circular silicon wafer on which has been deposited a predetermined volume of photoresist composition is subjected to high-speed (e.g., 500 to 6000 rpm) centrifugal whirling to cause the photoresist to spread out evenly as a layer along the wafer surface and such that excess photoresist is spun off the edges of the wafer.

Spin-coating per se is well-known in the art, as is the equipment for such coating and the process conditions employed therein, e.g., to bring about coatings of particular thickness. See, e.g., S. Wolf and R. N. Tauber, "Silicon Processing For The VLSI Era", Volume 1 (Process Technology) (Lattice Press, Sunset Beach, Calif. 1986), incorporated herein by reference, and Skidmore, K., "Applying Photoresist For Optimal Coatings", Semiconductor International, February 1988, pp. 57–62, also incorporated herein by reference.

Despite its widespread use, certain undesirable results also accompany spin-coating. Thus, owing to the surface tension of the resist composition, some of the resist may wick around to and coat the back side edge of the wafer during the spin-coating process. Also, as the spin-coating process progresses, the resist becomes progressively more viscous as solvent evaporates therefrom and resist being spun off the wafer in the latter stages of the process can leave fine whiskers ("stringers") of resist which dry on the edge of the wafer. So too, as the resist continues to dry and increase in viscosity during the spin-coating process, excess resist is less likely to leave the wafer and instead builds up as an edge-bead at the outer reaches of the wafer surface.

These coating-related problems can cause significant difficulties in the overall integrated circuit fabrication process. Resist on the back side of the wafer can be deposited elsewhere and cause contamination, and also prevents the wafer from lying flat on ultraflat surfaces, thereby affecting focus, alignment, planarity, and the like, in subsequent imaging steps. Whiskers on the wafer edges can easily break off in subsequent processing steps and cause particulate contamination in virtually all of the manufacturing equipment. Finally, the edge-bead leads to a distorted surface which can greatly affect focus, alignment, planarity and the like.

The art is aware of the problems associated with residual resist at the edges and sides of the wafer, and generally seeks to overcome them by application at the edge of the wafer of a small stream of a solvent for the resist so as to dissolve and remove the unwanted residue. In many cases, the solvent stream is applied to the backside edge of the wafer and is permitted to wick around by capillary action to the front edges so as to remove backside edge residue, whiskers and edge bead. With certain newer equipment, it is possible to apply the solvent stream from both front and back sides of the wafer simultaneously. In all cases, the object essentially is to remove from the wafer a strip of resist which is adhered to the wafer sides, the back surface outer edges of the wafer, and the outer edges of the front surface of the wafer, which strip typically is at least about 0.5 mm in thickness, and often can be up to 4.0 mm thick. See in this regard, Wolf and Tauber, supra; Skidmore, supra; and N. Durrant and P. Jenkins, "Defect Density Reduction Utilizing Wafer Edge Resist Removal", Microcontamination, April 1985, pp. 45–51, incorporated herein by reference.

Positive-acting photoresists are those most commonly employed in the manufacture of integrated circuits, and typically comprise a binder resin (e.g., a phenol-aldehyde condensation polymer such as a novolak) and a photoactive compound (e.g., an o-quinonediazide) in a suitable organic solvent. For such photoresists, the solvent conventionally employed in removal of the unwanted resist from these edge and side areas after spin-coating (generally termed "edge bead removal (EBR)" processes), is butyl acetate or mixtures of butyl acetate and alcohol. These solvents are not without their own difficulties, however, most notably with respect to their low flash point, and special precautions are required in their handling and use, particularly to avoid spillage during transfer operations.

Generally speaking, the differentiation point between flammability and combustibility is 100° F. (38° C.), TCC, and thus edge bead removal solvents having flash points above 100° F. would be highly desirable. Solvents which have been investigated as possible replacements for the butyl acetate or butyl acetate/alcohol EBR solvents include those which are commonly used in the positive photoresist compositions themselves, such as ethylene glycol monoethyl ether acetate (Cellosolve acetate), propylene glycol monomethyl ether acetate, ethyl 3-ethoxy propionate, and ethyl lactate. Despite desirably low flash points, these solvents do not function well in edge bead removal processes, particularly those involving backside application, in that they typically result in less than 0.25 mm removal.

The primary object of the present invention is to provide a solvent composition for use in edge residue removal processes in integrated circuit and related fabrication sequences, which has a suitably low flash point (i.e., greater than 100° F.) and which efficiently and effectively removes the resist residue in question even when applied in a backside solvent application technique.

SUMMARY OF THE INVENTION

This and other objects as will be apparent are achieved by the provision herein of compositions comprised of ternary mixtures of alkyl acetate, alkyl alcohol and water, and the provision herein of resist residue removal processes employing compositions comprised of ternary mixtures of alkyl acetate, alkyl alcohol and water.

The alkyl acetates for use in the ternary mixtures according to the invention are those corresponding to the formula

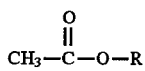

where R is a $C_4$ to $C_8$ alkyl, i.e., butyl, pentyl, hexyl, heptyl and octyl in any of their isomeric forms, and mixtures thereof.

The alkyl alcohols for use in the ternary mixtures according to the invention are those corresponding to the formula

where R has the meaning above, with the understanding that the hydroxyl group need not be a terminal group (i.e., the alcohols can be primary, secondary or tertiary alcohols).

Generally speaking, the alkyl acetate comprises from about 60 to about 94 weight percent of the ternary mixture; the alkyl alcohol comprises from about 5 to about 39 weight percent of the ternary mixture; and water comprises from about 1 to about 5 weight percent of the ternary mixture. In the preferred embodiments of the invention, the alkyl acetate comprises from about 75 to about 89 weight percent of the ternary mixture; alkyl alcohol comprises from about 10 to about 25 weight percent; and water comprises from about 1 to about 3 weight percent.

The preferred alkyl acetates are those in which the alkyl is $C_5$ or $C_6$, or mixtures of these with each other or with other alkyl acetates according to the invention. The preferred alkyl alcohols are those in which the alkyl also is $C_5$ or $C_6$, or mixtures of these with each other or with other alkyl alcohols according to the invention.

In all cases, the choice of particular alkyl acetates and alkyl alcohols, and the choice of respective weight percentages thereof along with water, is dictated by the need to obtain mixtures having a flash point greater than 100° F. and the ability of the mixture to effect edge residue removal of at least 0.5 mm of resist from silicon wafers spin-coated with positive-acting photoresist compositions based upon novolak resins and o-quinonediazide photoactive compounds, when the removal process involves backside application of the removal composition to the silicon wafer.

DETAILED DESCRIPTION OF THE INVENTION

The term "edge residue" is used herein generically to describe unwanted photoresist composition adhered to the outer peripheral edges of the front and back planar surfaces of the wafer substrate and to the side surfaces of the wafer substrate, whether in the form of stringers, a thickened edge bead, or simply a coating of resist, as a consequence of the spin-coating process.

The choice of solvents and solvent mixtures for use in removing residual edge resist from wafers spin-coated with positive-working photoresist compositions is quite large when viewed in terms of potentially sufficient dissolving ability to achieve the desired goal. According to the present invention, however, additional constraints are imposed on the solvent for removal of residual resist, including high flash point (greater than 100° F.), low toxicity, low cost, reasonable volatility, wide availability, acceptable odor, and effectiveness in removal of at least about 0.5 mm of resist on the front side edges of the wafer substrate when employed in a backside application technique.

With these added requirements, it was found that many solvents having acceptably high flash points were either ineffective in removal of sufficient resist residue or unavailable in commercially acceptable quantities and reasonable costs, while many solvents effective in the removal process had flash points which were unacceptably low. This was particularly true of the alkyl acetates, some of which were highly effective removers of residual edge resist but had flash points below 100° F. (e.g., butyl, amyl and hexyl acetates), while others which did possess higher flash points were either unavailable in commercial quantities (e.g., heptyl acetates) or ineffective in resist removal (e.g., octyl acetates).

Surprisingly, it was found possible to prepare ternary, presumably azeotropic, mixtures of alkyl acetates, alkyl alcohols and water which, by suitable choice of particular compounds and proportions, possessed the desired combination of required properties. Although alkyl acetates are known to form azeotropic mixtures, the water azeotropes thereof tend to have lower flash points than the acetate alone and only minor quantities of water can be employed due to solubility considerations, while alcohol admixtures with the acetates are either ineffective in raising the flash point and/or limit resist removal efficiency. Nevertheless, it was found that the ternary mixtures effectively brought about both resist removal effectiveness and acceptably high flash points.

The following examples are provided in demonstration and illustration of the foregoing.

In all the examples, as set forth in Table I, the only variable was the composition of the solvent for removing resist edge residue. In Table I, the compositions are set forth in weight percent (in all cases, the "water" is deionized water), the flash point is in °F. TCC, and the "Effectiveness" was judged as the ability to remove at least 0.5 mm of resist during the described backside solvent application process.

In each example, 100 to 200 mm silicon wafers were spin-coated with a liquid positive-acting photoresist composition based upon a phenol-aldehyde condensation polymer as the binder resin and an o-quinonediazide as the photoactive compound (e.g., EPA 914 EZ28 or EL 2015-24, available from MacDermid, Inc., Waterbury, Conn.) using a commercially-available SVG Coat/Bake spin-coating unit according to the following pre-programmed sequence:

1. Spin low speed, 0 KRPM, 30 seconds
2. Spin low speed, 0.4 KRPM, 1 second
3. Dispense photoresist composition, 0.4 KRPM
4. Spin high speed, 4.0 KRPM, 25 KRPM/sec. acceleration, 20 seconds.

Each particular edge residue solvent composition was applied by backside-only application using one of the following pre-programmed sequences:

Sequence A
1. Spin low speed, 0.4 KRPM, 2 seconds
2. Rinse, 0.4 KRPM, 10 seconds
3. Spin low speed, 0.4 KRPM, 5 seconds
4. Spin low speed, 0.7 KRPM, 10 seconds Sequence B
1. Spin low speed, 0.5 KRPM, 1 second
2. Rinse, 0.5 KRPM, 5 seconds
3. Spin low speed, 0.5 KRPM, 5 seconds
4. Rinse, 0.5 KRPM, 5 seconds
5. Spin low speed, 0.5 KRPM, 1 second
6. Spin high speed, 2.0 KRPM, 25 KRPM/sec. acceleration, 8 seconds.

The results are set forth in Table I.

TABLE I

| Example | Composition | Flash Point (°F.) | Effectiveness |
|---|---|---|---|
| 1 | 80% amyl acetate<br>15% amyl alcohol<br>5% water | 107 | Yes |
| 2 | 78% hexyl acetate<br>20% hexyl alcohol<br>2% water | 105 | Yes |
| 3 | 78% amyl acetate<br>20% 2-methyl-1-butanol<br>2% water | 104 | Yes |
| 4 | 89% amyl acetate<br>10% 2-methyl-1-butanol<br>1% water | 103 | Yes |
| 5 | 80% amyl acetate<br>18% 2-methyl-1-butanol<br>2% water | 104 | Yes |
| 6 | 88.5% amyl acetate<br>10% 2-methyl-1-butanol<br>1.5% water | 103 | Yes |
| 7 | 80% amyl acetate<br>18% amyl alcohol<br>2% water | 104 | Yes |
| 8 | 80% amyl acetate<br>20% amyl alcohol | 98 | Yes |
| 9 | 50% amyl acetate<br>50% amyl alcohol | 102 | No |

The solvent compositions described herein possess the inherent characteristics of a flash point above 100° F. and the ability to effect edge residue removal of at least 0.5 mm of resist on silicon wafers spin-coated with positive-acting photoresist compositions based upon novolak resin binder and o-quinonediazide photoactive compound, where the removal process involves backside application of the solvent composition to the silicon wafer. While the primary functionality of the solvent composition according to the invention is in edge residue removal processes as set forth above, solvent compositions possessing the above characteristics according to the invention can also be employed in a wide variety of applications where removal of organic films or portions thereof from a substrate is required, irrespective of whether the substrate is silicon or whether the polymer film is a photoresist or whether the photoresist is positive-acting or whether the photoresist composition contains particular components. The same is true in edge residue removal processes, where the solvent compositions, although formulated specifically for effecting removal even when a backside-only application process is employed, can also be employed in any other desired manner or process sequence.

The foregoing description and examples are to be understood as illustrating the present invention, and are not intended to be limiting of the scope of the invention as defined in the appended claims.

What is claimed is:

1. A method for removing photoresist from a substrate surface on which said photoresist has been coated, comprising contacting said coated substrate with a solvent composition that has a flashpoint of above 100° F. and is effective to remove the excess edge residue of a photoresist composition which comprises a novolak resin and an o-quinonediazide photoactive compound which has been spin coated onto a silicon wafer substrate surface, by application of said solvent composition to backside of said substrate, wherein said solvent composition comprises an admixture of (1) from 60 to about 94% by weight or an acetate component selected from a group consisting of alkyl acetate, wherein said alkyl is a $C_4$ to $C_8$ alkyl, and mixtures of said alkyl acetates; (2) from about 5 to about 39% by weight of an alcohol component selected from the group consisting of alkyl alcohol, wherein said alkyl is a $C_4$ to $C_8$ alkyl, and mixtures of said alkyl alcohols; and (3) from about 1 to about 5% by weight water.

2. The method of claim 1 wherein the photoresist comprises a layer of positive-working photoresist.

3. The method of claim 1 wherein said solvent composition is effective to remove the excess edge residue of a photoresist composition which comprises a novolak resin and an o-quinonediazide photoactive compound which has been spin coated onto a silicon wafer substrate surface, by application of said solvent composition to the backside of said substrate.

4. The method of claim 1 wherein said acetate component is selected from the group consisting of $C_5$ alkyl acetate, $C_6$ alkyl acetate, and mixtures thereof.

5. The method of claim 1 wherein the alcohol component is selected from the group consisting of $C_5$ alkyl alcohol, $C_6$ alkyl alcohol, and mixtures thereof.

6. A method for removing photoresist from a substrate surface on which said photoresist has been coated, comprising contacting said coated substrate with a solvent composition that has a flashpoint of above 100° F. and is effective to remove the excess edge residue of a photoresist composition which comprises a novolak resin and an o-quinonediazide photoactive compound which has been spin coated ohm a silicon wafer substrate surface, wherein said solvent composition comprises an admixture of (I) from 60 to about 94% by weight of an acetate component selected from a group consisting of alkyl acetate, wherein said alkyl is a $C_4$ to $C_8$ alkyl, and mixtures of said alkyl acetates; (2) from about 5 to about 39% by weight of an alcohol component selected from the group consisting of alkyl alcohol, wherein said alkyl is a $C_4$ to $C_8$ alkyl, and mixtures of sold alkyl alcohols; and (3) from about 1 to about 5% by weight water.

7. The method of claim 6 wherein said acetate component is selected from the group consisting of $C_5$ alkyl acetate, $C_6$ alkyl acetate, and mixtures thereof.

8. The method of claim 6 wherein the alcohol component is selected from the group consisting of $C_5$ alkyl alcohol, $C_6$ alkyl alcohol, and mixtures thereof.

* * * * *